US012808651B2

(12) United States Patent
Xu et al.

(10) Patent No.: US 12,808,651 B2
(45) Date of Patent: Nov. 24, 2026

(54) CABLE MOTION MONITORING

(71) Applicant: Viper Innovations Limited, Bristol (GB)

(72) Inventors: Guangqiao Xu, Bristol (GB); Nathan Cartlidge, Bristol (GB)

(73) Assignee: VIPER INNOVATIONS LIMITED, Bristol (GB)

(*) Notice: Subject to any disclaimer, the term of this patent is extended or adjusted under 35 U.S.C. 154(b) by 110 days.

(21) Appl. No.: 18/852,296

(22) PCT Filed: Mar. 16, 2023

(86) PCT No.: PCT/GB2023/050618
§ 371 (c)(1),
(2) Date: Sep. 27, 2024

(87) PCT Pub. No.: WO2023/187313
PCT Pub. Date: Oct. 5, 2023

(65) Prior Publication Data

US 2025/0198738 A1 Jun. 19, 2025

(30) Foreign Application Priority Data

Mar. 30, 2022 (GB) ..................................... 2204561

(51) Int. Cl.
*G01R 31/11* (2006.01)
*G01B 7/16* (2006.01)
(Continued)

(52) U.S. Cl.
CPC ............. *G01B 7/18* (2013.01); *G01R 31/083* (2013.01); *G01R 31/11* (2013.01); *G01R 31/58* (2020.01)

(58) Field of Classification Search
CPC ........ G01B 7/18; G01R 31/083; G01R 31/11; G01R 31/58; G01R 31/085
See application file for complete search history.

(56) References Cited

U.S. PATENT DOCUMENTS 8,359,177 B2 1/2013 Lelong et al.
11,519,759 B2 * 12/2022 Tadakuma ........... G01B 11/161
(Continued)

FOREIGN PATENT DOCUMENTS

DE 102018204171 A1 9/2019
JP H0372724 A 3/1991
(Continued)

OTHER PUBLICATIONS

Berger et al., Spread Spectrum Techniques for Measurement of Dielectric Aging on Low Voltage Cables for Nuclear Power Plants. IEEE Transactions on Dielectrics and Electrical Insulation. Jun. 2021;28(3):1028-1033.

(Continued)

*Primary Examiner* — David J Bolduc
(74) *Attorney, Agent, or Firm* — McCarter & English, LLP; Jonathan C. Lovely

(57) ABSTRACT

A method (900) of detecting motion of an electrical cable comprising at least one core comprises sending (S91) a time-domain reflectometry, TDR, signal from a point of measurement along each core of the cable. Reflections of the TDR signal from each core are received (S92) at the measurement point, and a reflectogram is generated (S93) for each core by correlating the TDR signal with the reflections. Each reflectogram is a waveform of relative impedance change against distance from the point of measurement. Motion of the cable is detected by comparing (S94) the reflectogram generated for each core with a reference reflectogram for the respective core, where each reference reflectogram was previously obtained when the cable was in a baseline position.

20 Claims, 7 Drawing Sheets

(51) Int. Cl.
*G01R 31/08* (2020.01)
*G01R 31/58* (2020.01)

(56) References Cited

U.S. PATENT DOCUMENTS

| | | | | |
|---|---|---|---|---|
| 2010/0277329 | A1 | 11/2010 | Worzyk | |
| 2011/0304340 | A1 * | 12/2011 | Hall | G01R 31/11 324/533 |
| 2017/0199235 | A1 | 7/2017 | Jeon et al. | |
| 2023/0258739 | A1 | 8/2023 | Sonoda et al. | |

FOREIGN PATENT DOCUMENTS

| | | | |
|---|---|---|---|
| JP | 7-62640 | A | 3/1995 |
| JP | 2011523043 | A | 8/2011 |
| JP | 2015072217 | A | 4/2015 |
| JP | 2017520750 | A | 7/2017 |
| JP | 2021162449 | A | 10/2021 |
| KR | 10-1561832 | B1 | 10/2015 |
| KR | 10-2286814 | B1 | 8/2021 |

OTHER PUBLICATIONS

Kingston et al., A SSTDR Methodology, Implementations, and Challenges. Sensors. 2021;21:5268, 17 pages.

Nicholls-Lee et al., Non-destructive examination (NDE) methods for dynamic subsea cables for offshore renewable energy. Prog Energy. 2022;4:042011, 21 pages.

Great Britain Office Action for Application No. GB2204561.1, dated Sep. 22, 2022, 4 pages.

International Search Report and Written Opinion for Application No. PCT/GB2023/050618, dated Jun. 15, 2023, 15 pages.

International Preliminary Report on Patentability for Application No. PCT/GB2023/050618, dated Jun. 26, 2024, 19 pages.

* cited by examiner

CABLE MOTION MONITORING

CROSS-REFERENCE TO RELATED APPLICATIONS

This application is a 35 U.S.C. § 371 national stage filing of International Application No. PCT/GB2023/050618, filed on Mar. 16, 2023, which claims priority from United Kingdom Application No. 2204561.1, filed on Mar. 30, 2022. The entire contents of each of the aforementioned applications are expressly incorporated herein by reference in their entirety as part of the disclosure of the present application.

The present disclosure generally relates to monitoring motion of a cable. Non-limiting examples of the disclosure relate to monitoring motion of a subsea power cable using time-domain reflectometry.

Subsea power cables are used to distribute electricity generated by offshore wind turbines to an onshore power grid. However, subsea cables are subjected to forces from the sea, which can cause the cables to fail over time. For example, tides and vortices may cause a subsea cable to move and, over a long enough period of time, such motion can cause a conductor and/or insulator in the cable to degrade and eventually fail. Such failures are difficult to locate, costly to repair and cause disruption to the power supply.

In order to facilitate repairs and minimise the cost of operating and maintaining subsea cables, non-destructive monitoring systems are used to identify the existence and location of a fault. For example, the applicant's earlier patent EP 2 339 359 describes a subsea line monitoring device that is able to output a signal indicative of the integrity of a subsea cable. That device uses time-domain reflectometry to help identify the precise location of a fault.

It is desirable to prevent failure of cables, such as subsea power cables, by identifying potential failures before they occur, so that preventative maintenance can be performed.

SUMMARY

The present disclosure provides a method and apparatus for detecting motion of an electrical cable. By detecting motion of a cable, and monitoring such motion over time, motion that may eventually lead to failure of the cable can be detected. Moreover, by detecting motion that may lead to failure of the cable, preventive maintenance can be performed to prevent such failure.

In accordance with a first aspect, a method of detecting motion of an electrical cable is provided. The electrical cable comprises at least one core. The method comprises: sending a time-domain reflectometry (TDR) signal from a point of measurement along each core of the cable; receiving, at the point of measurement, one or more reflections of the TDR signal from each core; generating reflectometry data for each core by correlating the TDR signal sent along each core with the one or more reflections of the TDR signal received from a respective core, wherein the reflectometry data is indicative of an impedance change at each of a plurality of points along a respective core; and detecting motion of the cable by comparing the reflectometry data generated for each core with reference reflectometry data for the respective core, the reference reflectometry data having been previously obtained when the cable was in a baseline position.

The inventors have discovered that motion of the cable causes a measurable change in the impedance of the cable's cores. The inventors have further discovered that motion of the cable can be detected using time-domain reflectometry.

That is, time-domain reflectometry has been found to be sufficiently sensitive to detect the small changes in impedance caused by motion of the cable, and to allow changes in impedance caused by motion of the cable to be distinguished from changes in impedance with other causes.

The techniques disclosed herein can be used to detect motion of the cable even when the cable is energised (i.e., when connected to a voltage and/or when carrying a current), without interfering with the normal operation of the cable. The present techniques are, therefore, suitable for long-term non-invasive monitoring of the cable to identify motion that might lead to its failure.

The electrical cable may be any suitable type of cable. For example, the electrical cable may be an underwater power cable, such as a subsea power cable. The cable need not be sited underwater, however, and the techniques disclosed herein are also applicable to cables sited underground, at ground level, or in the air (e.g., an overhead cable).

The point of measurement can be any point on the cable although, in practice, the point of measurement is typically at one end of the cable. For example, in the case of an umbilical power cable that connects offshore power generating equipment to an onshore power grid, the measurement point is typically at the onshore end of the cable. A signal generator for generating a TDR signal, and a signal processor for receiving reflections of the TDR signal, are generally located at the point of measurement.

The techniques disclosed herein detect motion of the cable with respect to a baseline position of the cable. The baseline position can be any position of the cable, and need not be known precisely. In particular, the cable need not be straight when it is in its baseline position. However, in order for a particular position of the cable to be regarded as a baseline position, reference reflectometry data must have been previously obtained with the cable in that position. The reference reflectometry data can have been generated in the same manner as that generated to detect motion of the cable, i.e., by sending one or more time-domain reflectometry signals from the point of measurement along each core of the cable, receiving one or more reflections of the TDR signal from each core, and correlating the TDR signals sent along each core with the one or more reflections of the TDR signal received from a respective core.

In general, the electrical cable has a plurality of cores. It is possible to detect motion of the cable by generating a reflectometry data for only a single core. However, it is possible to distinguish different types of motion by generating reflectometry data for multiple cores (and, in some examples, for all cores of the cable), as further discussed below.

In general, the geometry of the cable is known. For example, the number of cores is known, as is the position of each core with respect to the other cores. Each core that is used for time-domain reflectometry is electrically conductive, but this does not preclude the use of the present techniques with cables that additionally include other types of core (e.g., optical fibre cores).

In some embodiments, detecting motion of the cable comprises identifying bending, extension, contraction and/or torsion of the cable.

The techniques disclosed herein can detect and distinguish various types of motion of the cable, particularly bending, extension (and, conversely, contraction) and/or torsion. As used herein, "bending" refers to deviation of (the longitudinal axis of) the cable from a straight path. Bending is caused by an external force applied perpendicular to the longitudinal axis of the cable. As used herein, "extension"

refers to stretching of the cable along its longitudinal axis, whereas "contraction" refers to shortening of the cable along its longitudinal axis. Extension and contraction are respectively caused by an external tensile or compressive force applied along the longitudinal axis of the cable. As used herein, "torsion" refers to twisting of the cable around its longitudinal axis. Torsion is caused by an external torque applied around the longitudinal axis of the cable.

In some embodiments, sending the TDR signal comprises sending a plurality of TDR signals from the point of measurement along each core of the cable, each of the plurality of TDR signals being sent at a respective one of a plurality of points in time; receiving the one or more reflections comprises receiving a plurality of reflections from each core, each of the plurality of reflections corresponding to one of the plurality of TDR signals; and generating the reflectometry data comprises correlating each TDR signal sent along each core with its corresponding reflections.

By repeatedly generating reflectometry data covering a period of time, the motion of the cable can be monitored over time and/or the frequency of motion of the cable can be determined.

Generating the reflectometry data may comprise generating a plurality of reflectograms. Each reflectogram is a waveform of impedance change against distance along a respective core. Each reflectogram corresponds to a respective one of the plurality of TDR signals. That is, each TDR signal that is sent along a core produces a single reflectogram. The method may further comprise monitoring motion of the cable over a period of time by comparing each of the plurality of reflectograms generated for each core with a reference reflectogram for the respective core.

Monitoring motion of the cable over a period of time is useful for preventative maintenance of the cable. For example, by monitoring the motion of the cable over a period of time, motion that may eventually lead to failure of the cable can be detected and the cable can be repaired or replaced before failure occurs.

The reference reflectometry data may comprise a reference reflectogram for each core. That is, the reference reflectometry data may comprise a plurality of reflectograms, where each reflectogram quantifies the variation of impedance according to distance along a respective core when the cable is in the baseline position.

The method may further comprise selecting, from the reflectometry data, a measurement section for each core, wherein the measurement section comprises measurements of impedance change over time at a given point on the core. Detecting motion of the cable may comprise comparing the measurement section for each core with a reference time-series, wherein the reference time-series comprises measurements of impedance change over time at the given point on the core when the cable was in the baseline position.

For example, the reflectometry data may comprise a multi-dimensional time-series for each core, where the multi-dimensional time-series comprises measurements of impedance change at each of a plurality of points on the core, each measurement made at a respective one of a plurality of points in time. Selecting the measurement section may include selecting a measurement section of the multi-dimensional time-series for each core, the measurement section taken across a time axis of the multi-dimensional time-series for a core to obtain a waveform of impedance change against time.

Comparing the measurement section with a reference time-series may comprise applying a dynamic time warping algorithm to the measurement section and/or the reference time-series.

The propagation speed of TDR signals and their reflections can vary due to external factors, such as the temperature of the cable. Motion of the cable can be measured more accurately by using a dynamic time warping algorithm to compensate for differences in the propagation speed of signals between the measurement section and the reference time-series. The dynamic time warping algorithm can be applied to either the measurement section, the reference time series, or both.

In some embodiments, the method may further comprise determining a frequency of the motion of the cable. Determining the frequency of the motion of the cable may comprise analysing the reflectometry data to identify a time-varying impedance change of at least one core.

In some embodiments, the cable comprises a first core and a second core, and the method further comprises identifying a type of motion of the cable by comparing reflectometry data for the first core with reflectometry data for the second core.

Each type of motion (e.g., bending, extension, contraction and torsion) of the cable causes a characteristic change in the impedances of different cores. Therefore, by comparing the reflectometry data for different cores of a multi-core cable, different types of motion can be distinguished. For cables with more than two cores, the reflectometry data for all cores can be compared. In general, taking account of reflectometry data for a greater number of cores allows the motion of the cable to be identified more accurately.

Identifying the type of motion of the cable may comprise: determining that the first core exhibits a greater impedance change than the second core; and identifying bending of the cable when the first core exhibits a greater impedance change than the second core.

More specifically, bending of the cable can be identified when both cores exhibit a change in impedance with respect to the reference reflectometry data at a corresponding point along their length (e.g., a point at a common distance from the point of measurement), but where one core exhibits a greater change in impedance than the other. Such a change in impedance is characteristic of bending of the cable. This is because a core positioned towards the inside of the bend will experience a greater magnitude of bending than a core closer positioned towards the outside of the bend and, therefore, the core positioned towards the inside of the bend will exhibit a greater impedance change than the other core.

The method may further comprise determining a direction of bending of the cable. Alternatively or additionally, the method may comprise determining a location of a bend in the cable.

The method may further comprise virtually reconstructing a shape of the cable with respect to the baseline position.

In some embodiments, the TDR signal is a spread spectrum time-domain reflectometry signal.

The present disclosure could be implemented using any suitable time-domain reflectometry technique, such as sequence time-domain reflectometry (STDR) or spread spectrum time-domain reflectometry (SSTDR). SSTDR is considered to be more practical because the TDR signals injected into each core can be easily cross-correlated with their reflections. Moreover, such a cross-correlation inherently cancels electrical noise in the cable, which allows SSTDR-based implementations of the present disclosure to detect very small changes in impedance whose amplitude is comparable with the noise floor of the measurement system. This, in turn, allows the techniques disclosed herein to detect small motions of the cable.

In accordance with a second aspect, an apparatus configured to perform the method of any of methods disclosed herein is provided.

In accordance with a third aspect, a computer-readable medium is provided. The computer-readable medium comprises instructions which, when executed by a computer, cause the computer to perform any of the methods disclosed herein.

BRIEF DESCRIPTION OF THE DRAWINGS

For a better understanding of the invention and to show how the same may be carried into effect, reference will now be made, by way of example, to the accompanying drawings, in which:

FIG. 2(*b*) illustrates the difference between the measurement reflectogram and the reference reflectogram of FIG. 2(*a*);

DETAILED DESCRIPTION

Figure 1:
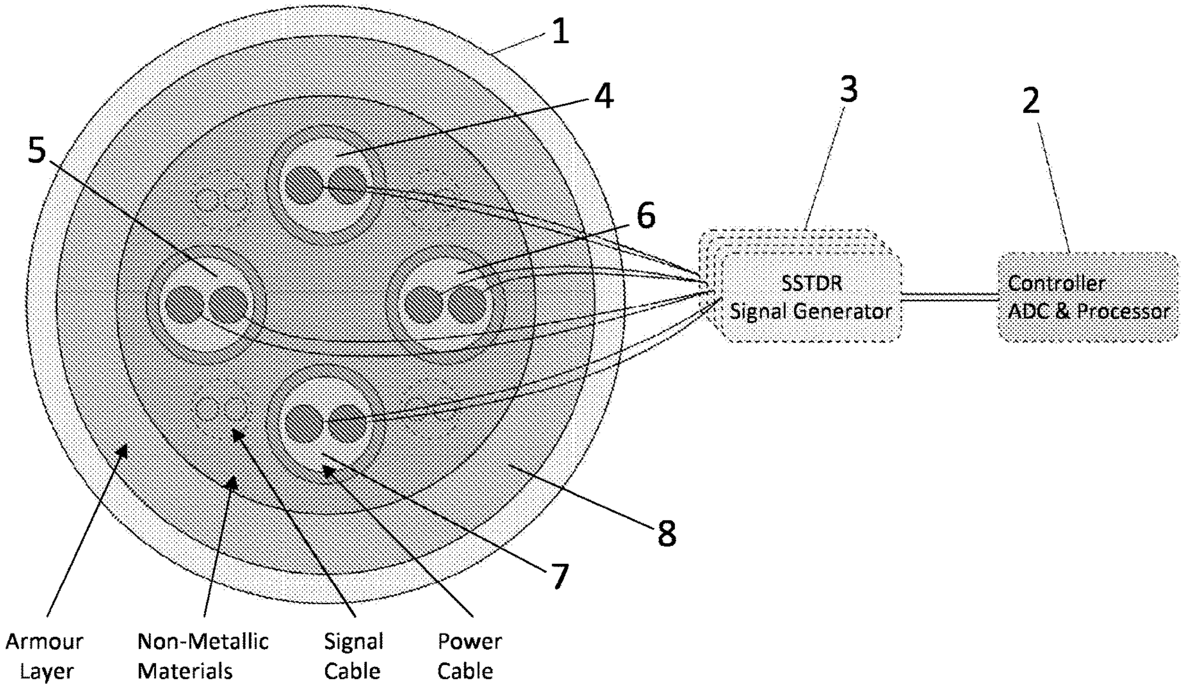
FIG. 1 shows an example of a power cable connected to an analysis system in accordance with the present disclosure.

The present disclosure involves the use of time-domain reflectometry to detect motion of an electrical cable.

Reflectometry involves injecting an electromagnetic test signal into a system, such as a transmission line or cable. The test signal is partially reflected at each impedance discontinuity in the cable. Each reflection of the test signal is determined by the impedance changes, as measured by the voltage reflection coefficient:

$$\rho = \frac{V_{reflectecd}}{V_{test}} = \frac{Z_L - Z_O}{Z_L + Z_O}$$

where $V_{reflected}$ is the voltage of a reflection, $V_{test}$ is the voltage of a test signal that produced that reflection, $Z_o$ is the characteristic impedance of the transmission line, and $Z_L$ is the impedance of the load or other impedance discontinuity. The larger the impedance change between $Z_o$ and $Z_L$, the larger the reflected signal (voltage) and, hence, the larger the reflection coefficient. Open circuits ($Z_L=\infty$) and short circuits ($Z_L=0$) produce the largest reflections, whereas smaller impedance changes produce smaller reflection coefficients.

Reflections of the test signal can be analysed to identify the presence of impedance discontinuities in the transmission line. The location of each impedance discontinuity can be estimated based on an estimated propagation speed of the test signal and the time interval between injecting the test signal and receiving its reflection.

There are many types of reflectometry methods, each of which uses a different type of test signal. These include time-domain reflectometry (TDR), sequence time-domain reflectometry (STDR) and spread spectrum time domain-reflectometry (SSTDR). In SSTDR, the test signal comprises a pseudorandom noise signal modulated onto a carrier signal. Each test signal can be correlated with its reflections by multiplying the pseudorandom noise signal with a received reflection and this, in turn, can be used to estimate the location of the impedance discontinuities that caused each reflection.

As noted above, a subsea power cable can be subject to motion. For example, an underwater vortex may induce unwanted motion in the cable. This motion can include a tension being applied to the cable, so that it is stretched. This results in a reduction in cross-sectional area of the cable, and hence each core of the cable, as the cable adapts to maintain the same volume. The reduction in cross-sectional area results in an impedance mismatch within the cores.

The motion, due to for example a vortex, may also cause bending of the cable. The motion may result in a single bend of the cable away from its normal direction. Alternatively, the motion may result in multiple bending motions of the cable as it is moved from side to side. The bending of the core causes an impedance mismatch as the cross-sectional area of the core changes in the vicinity of the bend. Additionally, bending of the cable causes a change in the cross-coupling of the core with other cores or the armour of the cable, which also causes a change in impedance.

In accordance with the present disclosure, motion of an electrical cable is detected by using TDR to identify changes in impedance caused by such motion.

FIG. 1 shows an example of an electrical cable 1 connected to an analysis system comprising a signal generator 2 and a processor 3. The processor 3 optionally comprises a controller and an analogue-to-digital converter (ADC). Although FIG. 1 shows the signal generator 2 and processor 3 as separate units, in some implementations the signal generator 2 and the processor 3 are provided in a single unit.

In the example shown in FIG. 1, the electrical cable 1 is a four-core cable with cores 4, 5, 6 and 7. Each core 4, 5, 6, 7 comprises two conductors which, in use, are connected to a phase voltage and neutral. Each core further comprises one or more insulating layers, which surround the conductors and insulate the conductors from each other and from other cores of the cable 1. The four cores 4, 5, 6, 7 are surrounded by an armour layer 8, which protects the cable against damage. Between the cores 4, 5, 6, 7, the electrical cable comprises non-metallic materials (sometimes referred to as a "filler") and, optionally, one or more signal cables. The signal cables may be electrical signal cables, optical fibres or a combination of both.

The electrical cable 1 shown in FIG. 1 is intended just as an example of a cable whose motion can be detected using the techniques disclosed herein. The techniques disclosed herein can be used to detect motion of electrical cables with more or fewer cores and/or with different structures. In general, the structure of the electrical cable 1 is known a priori. That is, the number of cores is known, as is the position of the cores with respect to each other. It is beneficial to have a priori knowledge of other structural features of the cable, since such knowledge can improve the accuracy of analysis of reflectometry data. Such structural features can include, but are not limited to, the distance between cores, the materials of each of the components of the cable, whether the cable has a shield or not, and/or the cross-sectional area of the cable.

In the example of FIG. 1, an SSTDR signal generator 2 is connected to an end of the cable 1. Specifically, the SSTDR generator 2 is connected to at least one core 4, 5, 6, 7 of the cable 1. In some implementations, multiple signal generators 2 are used, with each signal generator connected to a different core 4, 5, 6, 7. In other implementations, a single signal generator 2 is used, and a multiplexer is provided to connect the signal generator to each core 4, 5, 6, 7 in turn.

A test signal is selected on the signal generator 2. In the example of FIG. 1, the signal generator 2 is an SSTDR generator and the test signal is an SSTDR signal. However, another suitable type of TDR signal generator, such as an STDR signal generator, can be used instead. In selecting the test signal, parameters such as a test signal amplitude, the length of the pseudorandom code, a carrier frequency and a scan rate are selected. The amplitude of the test signal is typically in the range of 0.1 to 10 volts. The length of the pseudorandom (PN) code is typically in the range of $2^8-1$ to $2^{16}-1$ bits. The length of the PN code is limited by the processing power of the system and the longer the length, the higher the signal-to-noise ratio. The carrier frequency is typically in the range of 1 to 100 MHz. The scan rate is typically in the range of 10 to 100 Hz, i.e., ten to one hundred test signals are sent along each core every second. It will be appreciated that other suitable values for these parameters can be used, depending on the capabilities of the signal generator 2. An example SSTDR generator is the SSTDR S100 unit from Viper Innovations Limited (https://www.viperinnovations.com/sstdr-s100/).

The signal generator 2 generates a TDR test signal, and sends the TDR signal along at least one core 4, 5, 6, 7 of the cable 1. The same TDR signal may be sent along each core 4, 5, 6, 7, or a different signal may be sent along each core 4, 5, 6, 7. The TDR signal is reflected at each impedance discontinuity along the length of the at least one core 4, 5, 6, 7. The resulting reflections of the TDR signal are received by the signal generator 2. The signal generator 2 generates reflectometry data for each core 4, 5, 6, 7 by correlating (e.g., cross-correlating) the TDR signal sent along each core with the reflections received from a respective core. The reflectometry data may then be sent to the processor 3 for further analysis.

Figure 2A:
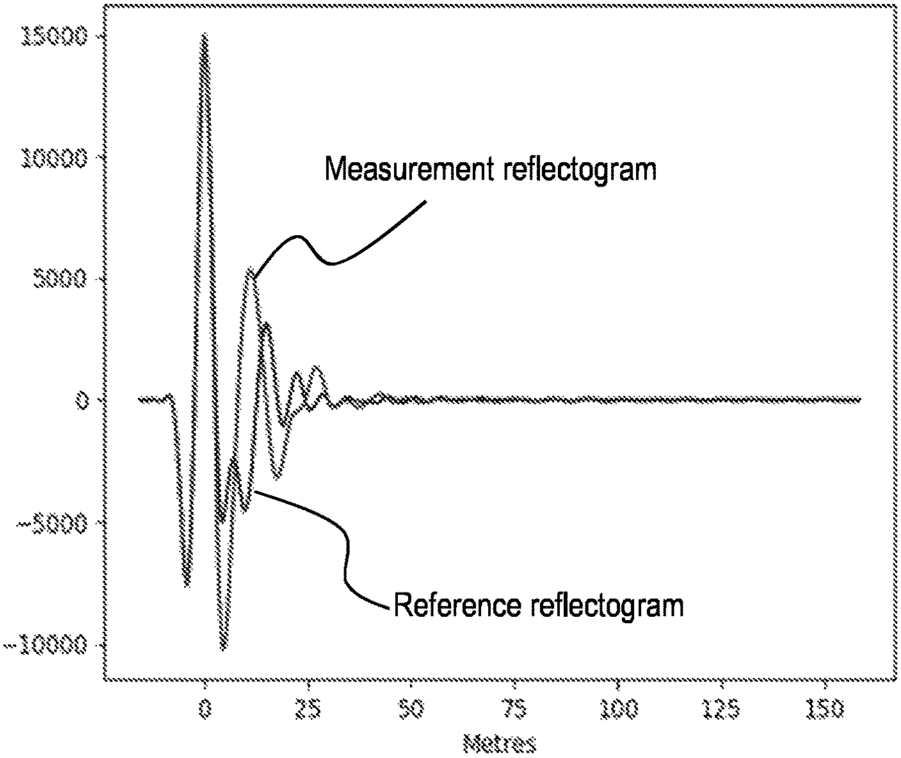
FIG. 2(*a*) illustrates a measurement reflectogram and a reference reflectogram obtained from a cable.
Figure 2B:
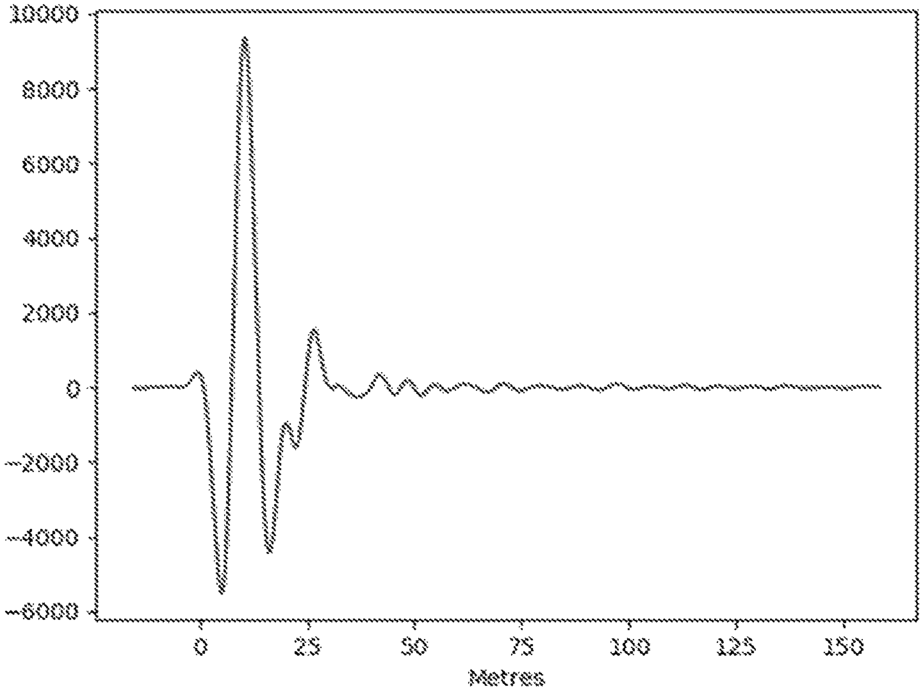

FIG. 2(*a*) and FIG. 2(*b*) show examples of reflectometry data generated by the SSTDR generator 2. The Y axis shows the relative level of impedance change. The X-axis shows the distance along the cable from the point of measurement in metres. The plots shown in FIGS. 2(*a*) and (*b*) are examples of reflectograms. FIG. 2(*a*) shows a reference reflectogram, which is obtained with the cable 1 in a baseline position. FIG. 2(*a*) also shows a measurement reflectogram, which is obtained after the cable 1 has moved. The reference reflectogram and the measurement reflectogram shown in FIG. 2(*a*) are both obtained from the same core of the cable 1. FIG. 2(*b*) shows the difference between the reference reflectogram and the measurement reflectogram. It can be seen that movement of the cable 1 introduces new impedance discontinuities that were not present when the cable 1 was in the baseline position. These new impedance discontinuities can be analysed to detect motion of the cable 1. Optionally, the impedance discontinuities introduced by motion of the cable 1 can be analysed to identify the type of motion (e.g., bending, extension, contraction and/or torsion), to determine the frequency of motion and/or to quantify the magnitude of motion (e.g., to measure the amount by which the cable 1 has bent).

Figure 3:
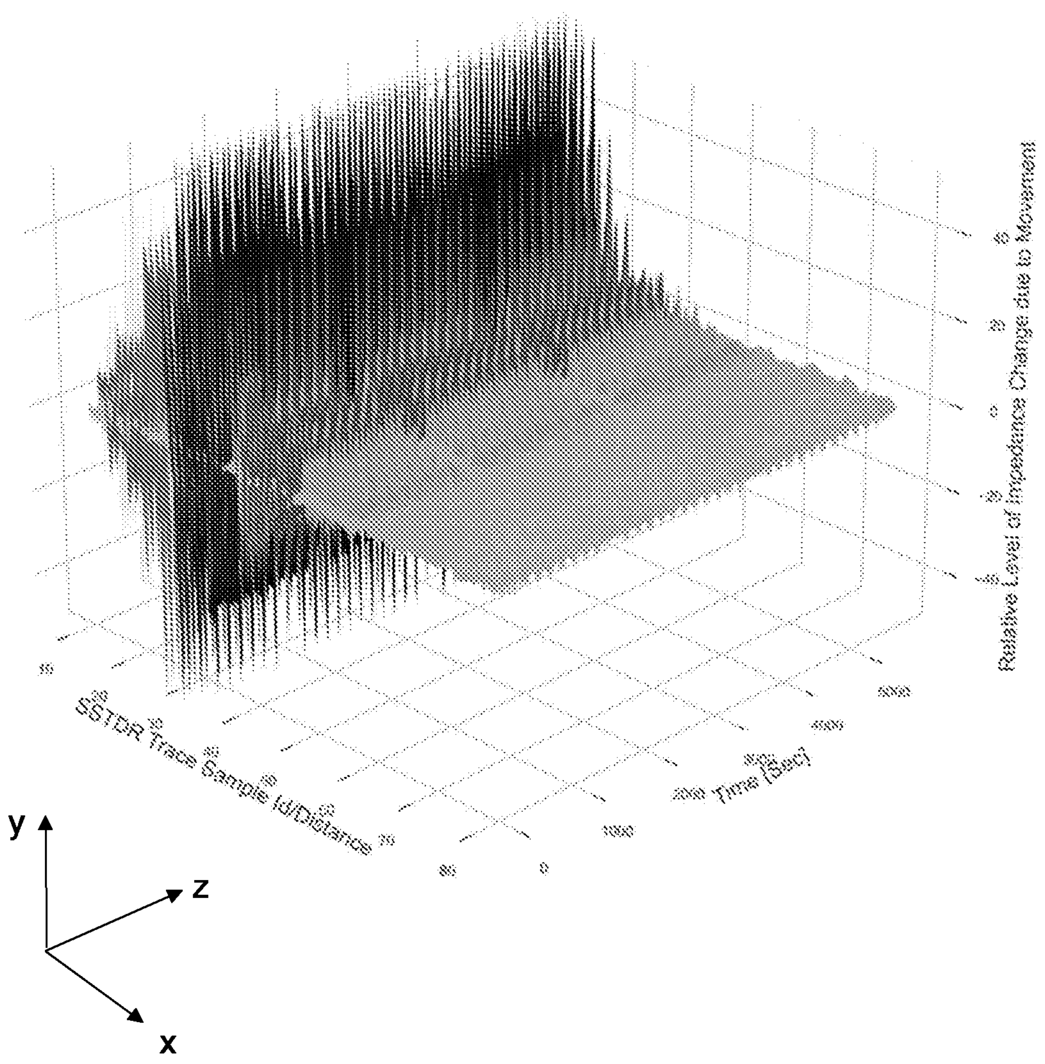
FIG. 3 shows all the SSTDR reflectograms obtained over time in an example measurement.

The obtained measurement reflectograms can be combined together into a multi-dimensional time-series, as shown in FIG. 3. Each measured reflectogram represents a measurement corresponding to a different point in time. By combining these waveforms over time, an indication of the impedance change of the core (or sections thereof) over time can be obtained and analysed.

FIG. 3 shows all the SSTDR reflectograms obtained over time in an example measurement. The x-axis represents distance, and corresponds to the x-axis of FIG. 2(*a*) and FIG. 2(*b*). The y-axis represents the relative impedance change and corresponds to the y-axis of FIG. 2(*a*) and FIG. 2(*b*). The z-axis represents time in seconds.

By taking a subset (or measurement section) of the data points on the x-axis (distance) and slicing that across the z-axis (time), the core being monitored can be split into multiple measurement sections for analysis. Each measurement section represents a section of the cable 1 along its length from the point of measurement (i.e. the end connected to the signal generator). The length of each measurement section is dependent on the resolution of the signal generator 2 in the time domain. As the time-domain resolution of the signal generator 2 is increased, the length of each measurement section can be shortened, and each measurement section begins to approximate a single point on the cable. A longer measurement section can be chosen, such that a measurement section refers to a longitudinally-extending region of the cable 1.

The measurement section can then be compared with a reference time-series. The reference time-series comprises measurements of impedance change over time with the cable 1 in the baseline position. The measurements of the reference time-series are taken from the same point on the cable 1 (or the same longitudinally-extending region of the cable 1) as the measurement section.

In an embodiment, for each measurement section, the overall similarity of the measurement waveform and reference time series can be calculated using dynamic time warping. Dynamic time warping is an algorithm used to measure similarity between two temporal sequences. It is used to dynamically compare time series data when the time indices between comparison data points do not line up perfectly. Applying dynamic time warping will transform a measurement section (detailed above) into a list of discrete numbers, with each number representing the level of impedance change for a given cable section compared to the point of reference.

Figure 4:
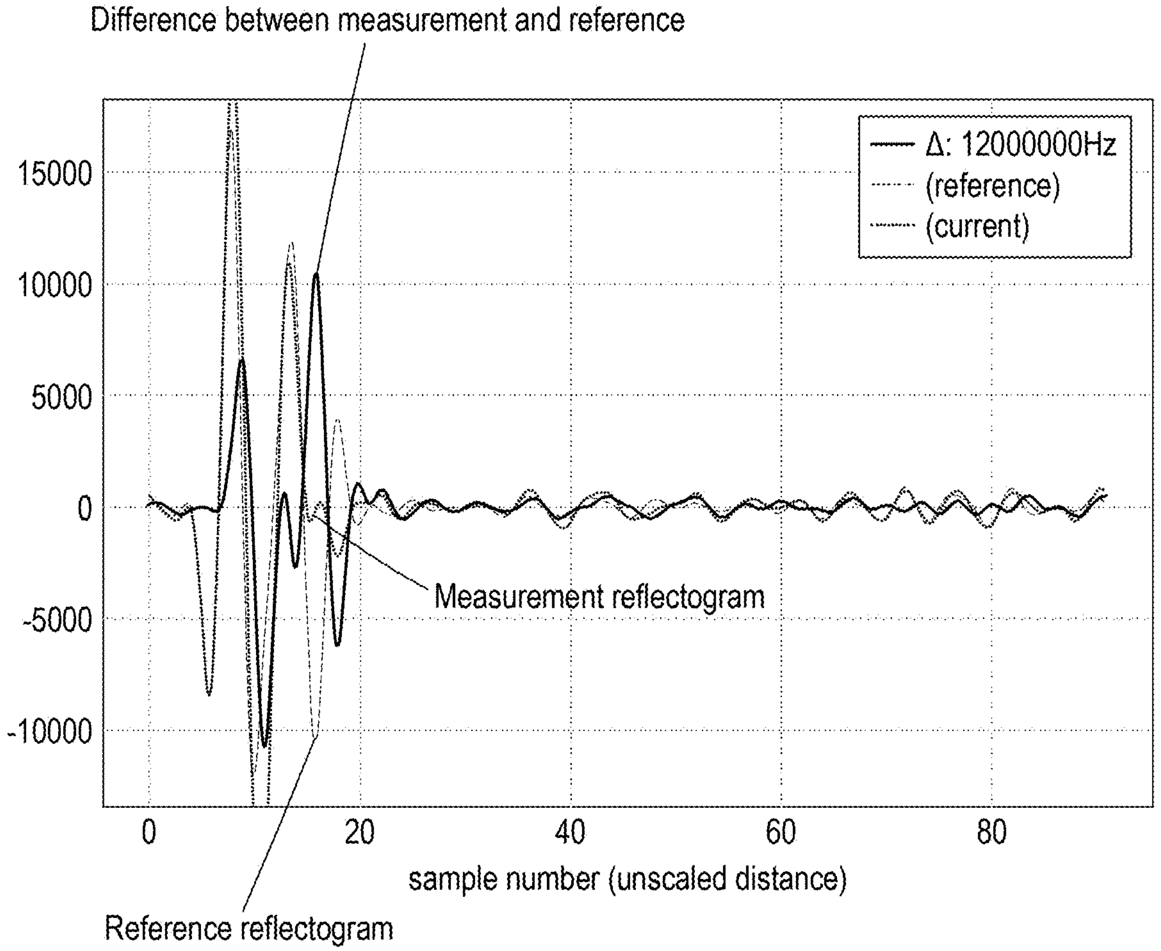
FIG. 4 illustrates example SSTDR reflectograms in an example measurement.

FIG. 4 illustrates another example of reflectometry data. Specifically, FIG. 4 illustrates a reference reflectogram, a measurement reflectogram, and a difference reflectogram, which is the difference between the measurement reflectogram and the reference reflectogram. Each reflectogram in this example is a plot of relative impedance change (y-axis) against sample number (y-axis), or ID of the SSTDR trace, which can be converted into distance based on the frequency of the applied test signal.

Figure 5:
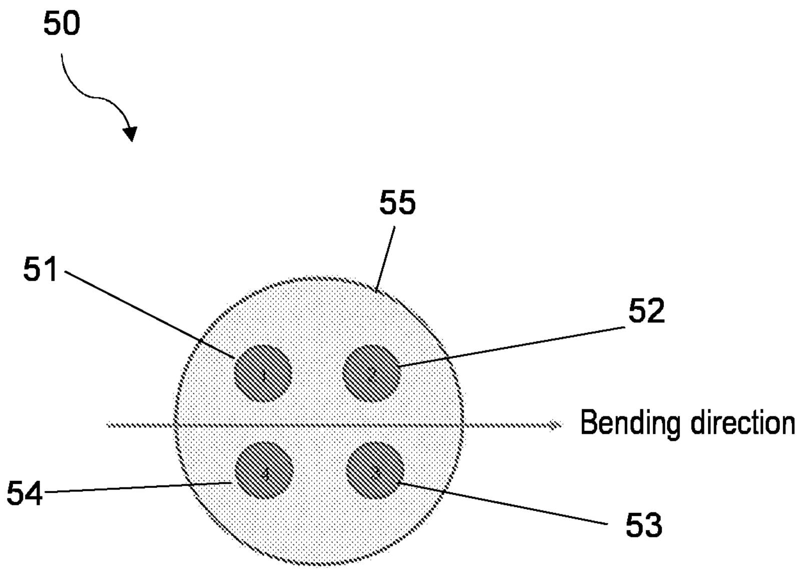
FIG. 5 illustrates bending of a four-core cable.

By monitoring multiple cores in a cable of known geometry, further information about the motion can be obtained. To illustrate, FIG. 5 shows a four-core cable with cores 51, 52, 54 and 54 and an armour layer 55. The cable may be bent in a direction of the arrow, i.e. towards the right-hand side. The cross-sectional area of each core 51, 52, 53, 54 will be subject to distortions as the core is bent. This distortion is a narrowing of the cross-sectional area of the core at the point of the bend, which results in an increase in resistance, and hence impedance, of the core at the bend.

As cores 51 and 54 are subjected to a greater magnitude of bending than cores 52 and 53, their cross-sectional areas are subjected to a greater change i.e. a greater decrease in cross-sectional area, than cores 52 and 53. In addition to the changes in physical shapes of the core, the relative capacitive coupling between the cores, and between each core and the armour 55 is also changed on bending.

Figure 6:
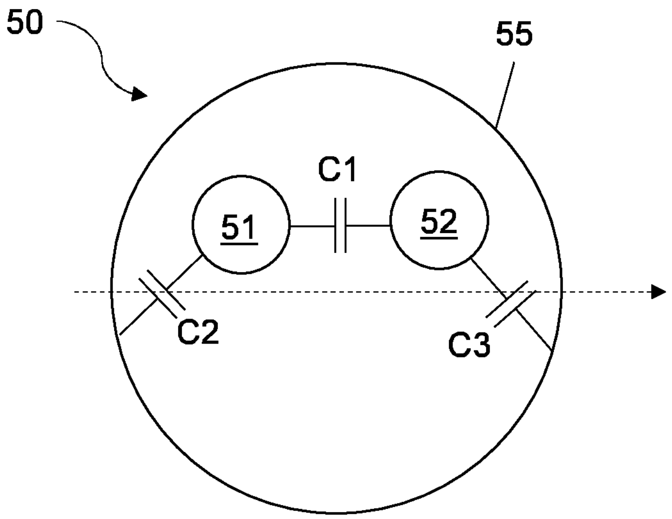
FIG. 6 illustrates an equivalent circuit for two of the four cores of the cable shown in FIG. 5.

FIG. 6 shows an equivalent circuit of two of the four cores of the cable 50 shown in FIG. 5. The cores 51, 52 of the cable 50 are capacitively coupled to each other, which is represented by capacitor C1. Furthermore, each core 51, 52 is capacitively coupled to the armour 55, which is represented by capacitors C2 and C3, respectively. When the cable is bent in the direction of the arrow, i.e. towards the right-hand side, there are physical changes in the cores 61 62, as described above with respect to cross-sectional area. Also, there are physical changes in the armour 55 around the point of the bend.

These physical changes in the cores 51, 52 and the armour 55 change the values of the capacitors C1, C2, C3, which result in a change in impedance that can be detected using TDR. It should be appreciated that FIG. 6 shows just two cores of the cable 50 for the sake of simplicity, and each of the cores 53, 54 shown in FIG. 5 will be similarly capacitively coupled to all other cores of the cable and to the armour layer 55.

Figure 7:
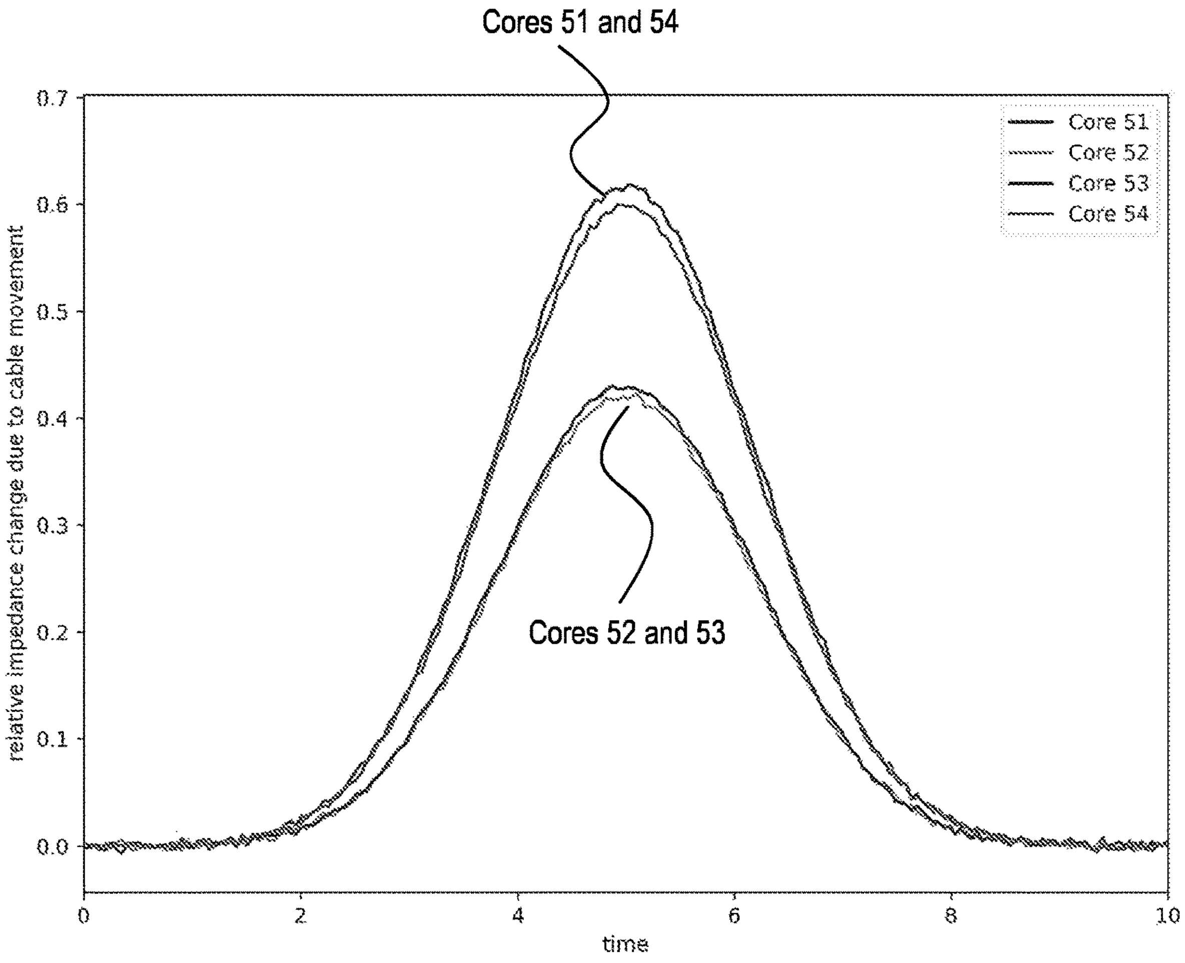
FIG. 7 illustrates changes in impedance over time when the four-core cable shown in FIG. 5 is bent.

FIG. 7 shows the how the impedance of each core 51, 52, 53, 54 changes when the cable 50 shown in FIG. 5 is bent. In the example of FIG. 7, a bending force is applied to the cable 50 between zero and five seconds, and the bending force is released after five seconds. At ten seconds, the cable 50 has reverted to its baseline position.

In FIG. 7, for a bend towards the right-hand side, cores 51 and 54 experience a greater relative impedance change than cores 52 and 53. This indicates a direction of the bend. A core towards the outside of the bend will experience a greater impedance change or discontinuity than a core closer to the inside of the bend. Therefore, the direction of the bend is detectable when a first core is closer to the outside of the bend than a second core, and the second core is closer to the inside of the bend than the first core.

These principles can be extended to detect other types of motion of an electrical cable, particularly extension, contraction and torsion of the cable. Each type of motion will result in a characteristic change in the impedance of each core of the cable. By measuring the changes in the impedance of each core, different types of motion can be distinguished from one another. Furthermore, the controller 3 can be calibrated to allow the magnitude of each type of motion to be determined based on the reflectometry data.

These principles can be further extended to virtually reconstruct the shape of the cable at any given time with respect to the baseline position. Specifically, the reflectometry data can be analysed on a section-by-section basis, where each section is a finite longitudinally-extending region of the cable. For each section, the reflectometry data can be analysed to determine whether the cable has moved and, if so, to determine what type of motion the cable has experienced and to determine the magnitude of that motion. By considering each section of the cable in turn, the overall movement of the cable with respect to the baseline position can be determined, and the shape of the cable with respect to the baseline position can be determined.

Figure 8:
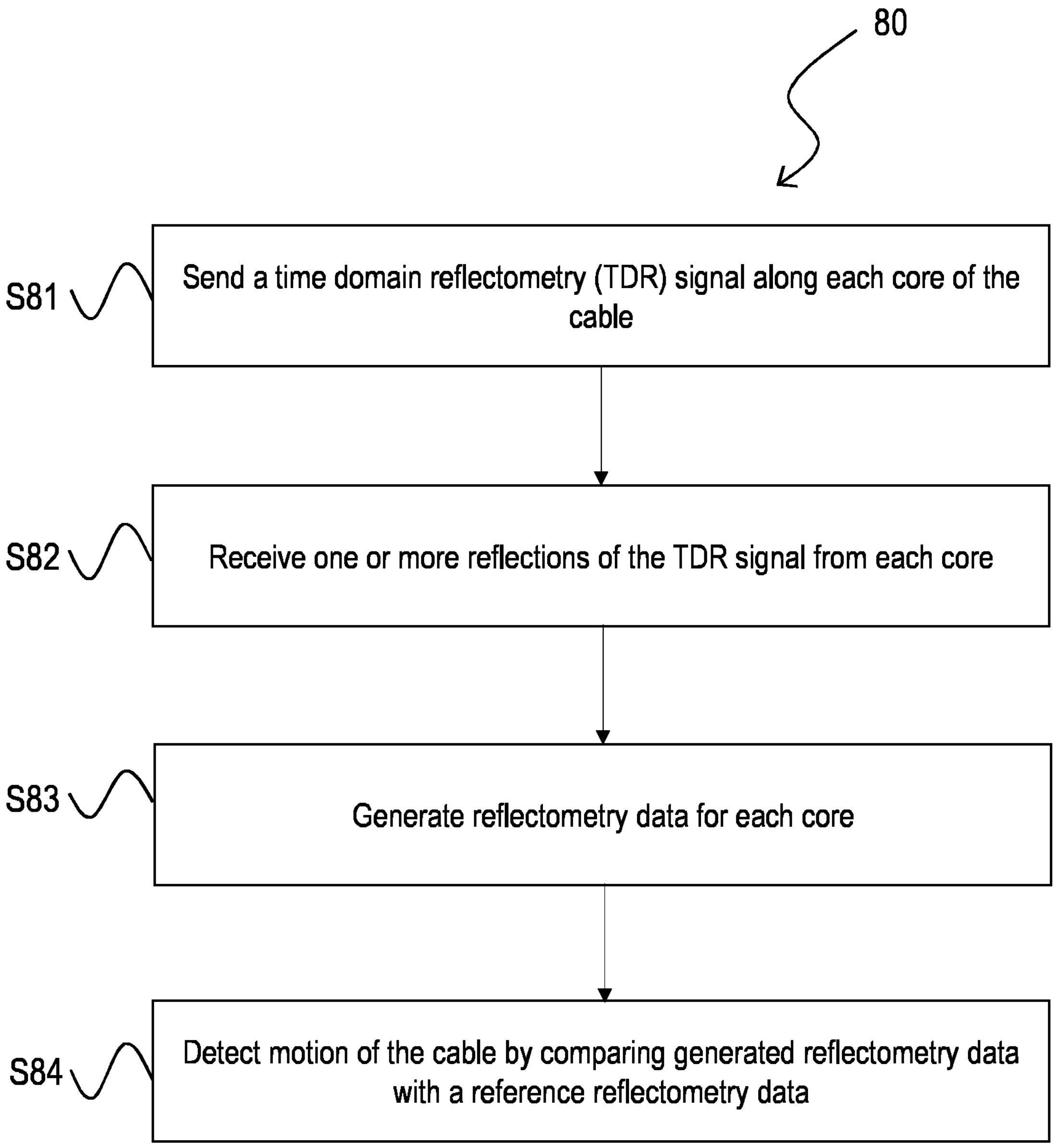
FIG. 8 is a flow diagram of a method of detecting motion of a cable in accordance with the present disclosure.

FIG. 8 is a flow diagram of a method 80 for detecting motion of an electrical cable 1 in accordance with the present disclosure. The method begins at S81, when a TDR signal is sent from a point of measurement along each core 4, 5, 6, 7 of the cable 1. The point of measurement is the end of cable 1 to which the signal generator 2 is connected. The TDR signal may be sent along each core 4, 5, 6, 7 by the signal generator 2.

At S82, one or more reflections of the TDR signal from each core are received at the point of measurement. The reflections may be received by the signal generator 2.

At S83, reflectometry data for each core 4, 5, 6, 7 is generated. The reflectometry data is generated by correlating the TDR signal sent along each core with the one or more reflections of the TDR signal received from a respective core. The reflectometry data is indicative of an impedance change at each of a plurality of points along a respective core. The reflectometry may comprise one or more reflectograms. The reflectometry data may be generated by the signal generator 2.

At S84, motion of the cable is detected by comparing the reflectometry data generated for each core with reference reflectometry data for the respective core. The reference reflectometry data was previously obtained (i.e., obtained at a time before performing operation S81) when the cable 1 was in a baseline position. The motion of the cable may be detected at S84 by the controller 3.

The method 80 can be performed by instructions stored on a processor-readable medium. The processor-readable medium may be: a read-only memory (including a PROM, EPROM or EEPROM); random access memory; a flash memory; an electrical, electromagnetic or optical signal; a magnetic, optical or magneto-optical storage medium; one or more registers of a processor; or any other type of processor-readable medium. In alternative embodiments, the present disclosure can be implemented as control logic in hardware, firmware, software or any combination thereof. The signal generator 2 and/or the controller 3 may be implemented by dedicated hardware, such as one or more application-specific integrated circuits (ASICs) or appropriately connected discrete logic gates. A suitable hardware description language can be used to implement the method described herein with dedicated hardware.

A first use case of the techniques disclosed herein is to monitor the health of undersea power cables. A significant proportion of cable failures in the subsea environment are due to repeated exposure to VIV (Vortices Induced Vibration), which have a characteristic frequency that can be identified from reflectometry data in accordance with the present disclosure. By monitoring the reflectometry data over time, it is possible to identify when cables have been exposed to vortices induced vibrations that could lead to their failure. An operator of the undersea power cable can be alerted prior to failure of the cable, to reduce potential downtime in power generation.

A second use case of the techniques disclosed herein is to assist in the design and testing of cables. Currently, new cable designs are tested by their manufacturers to make sure that they can survive a certain number of bending cycles. However, these tests provide very limited information at the end of the test cycle, other than a binary answer to whether the cable has survived the test or not. The techniques disclosed herein can allows cable manufacturers to better understand the properties of a cable during testing, and to understand what factors lead to failure of the cable.

Any measurements indicated throughout the description or in the figures are for only example purposes, and other dimensions may be used.

It will be understood that the invention has been described above purely by way of example, and that modifications of detail can be made within the scope of the claims. In particular, the sequence of operations shown in FIG. 8 is merely an example. Any of the operations shown in method 80 may be performed in a different order that achieves substantially the same result.

The invention claimed is:

1. A method of detecting motion of an electrical cable, the electrical cable comprising at least one core, the method comprising:
- sending a time-domain reflectometry (TDR) signal from a point of measurement along each core of the cable, wherein the TDR signal is sent while each core is energised by a phase voltage;
- receiving, at the point of measurement, one or more reflections of the TDR signal from each core, wherein the one or more reflections are received while each core is energised by a phase voltage;
- generating reflectometry data for each core by correlating the TDR signal sent along each core with the one or more reflections of the TDR signal received from a respective core, wherein the reflectometry data is indicative of an impedance change at each of a plurality of points along a respective core; and
- detecting motion of the cable by comparing the reflectometry data generated for each core with reference reflectometry data for the respective core, the reference reflectometry data having been previously obtained when the cable was in a baseline position.

2. The method of claim 1, wherein detecting motion of the cable comprises identifying bending, extension, contraction and/or torsion of the cable.

3. The method of claim 1, wherein:
- sending the TDR signal comprises sending a plurality of TDR signals from the point of measurement along each core of the cable, each of the plurality of TDR signals being sent at a respective one of a plurality of points in time;
- receiving the one or more reflections comprises receiving a plurality of reflections from each core, each of the plurality of reflections corresponding to one of the plurality of TDR signals; and
- generating the reflectometry data comprises correlating each TDR signal sent along each core with its corresponding reflections.

4. The method of claim 3, wherein:
- generating the reflectometry data comprises generating a plurality of reflectograms, each reflectogram being a waveform of impedance change against distance along a respective core, and where each reflectogram corresponds to a respective one of the plurality of TDR signals; and
- the method further comprises monitoring motion of the cable over a period of time by comparing each of the plurality of reflectograms generated for each core with a reference reflectogram for the respective core.

5. The method of claim 3, further comprising:
- selecting, from the reflectometry data, a measurement section for each core, wherein the measurement section comprises measurements of impedance change over time at a given point on the core; and
- wherein detecting motion of the cable comprises comparing the measurement section for each core with a reference time-series, wherein the reference time-series comprises measurements of impedance change over time at the given point on the core when the cable was in the baseline position.

6. The method of claim 5, wherein the comparing the measurement section with a reference time-series comprises:
- applying a dynamic time warping algorithm to the measurement section and/or the reference time-series.

7. The method of claim 1, further comprising:
- determining a frequency of the motion of the cable.

8. The method of claim 7, wherein determining a frequency of the motion of the cable comprises analysing the reflectometry data to identify a time-varying impedance change of at least one core.

9. The method of claim 8, wherein the cable comprises a first core and a second core, the method further comprising:
- identifying a type of motion of the cable by comparing reflectometry data for the first core with reflectometry data for the second core.

10. The method of claim 9, wherein identifying a type of motion of the cable comprises:
- determining that the first core exhibits a greater impedance change than the second core; and
- identifying bending of the cable when the first core exhibits a greater impedance change than the second core.

11. The method of claim 10, further comprising determining a direction of bending of the cable.

12. The method of claim 10, further comprising determining a location of a bend in the cable.

13. The method of claim 1, further comprising:
- virtually reconstructing a shape of the cable with respect to the baseline position.

14. The method of claim 1, wherein the TDR signal is a spread spectrum time-domain reflectometry signal.

15. An apparatus for detecting motion of an electrical cable, the electrical cable comprising at least one core, the apparatus comprising a processor configured to:
- send time-domain reflectometry (TDR) signal from a point of measurement along each core of the cable, wherein the TDR signal is sent while each core is energised by a phase voltage;
- receive, at the point of measurement, one or more reflections of the TDR signal from each core, wherein the one or more reflections are received while each core is energised by a phase voltage;
- generate reflectometry data for each core by correlating the TDR signal sent along each core with the one or more reflections of the TDR signal received from a respective core, wherein the reflectometry data is indicative of an impedance change at each of a plurality of points along a respective core; and
- detect motion of the cable by comparing the reflectometry data generated for each core with reference reflectometry data for the respective core, the reference reflectometry data having been previously obtained when the cable was in a baseline position.

16. A non-transitory computer-readable medium comprising instructions which, when executed by a processor, cause an apparatus comprising the processor to perform a method comprising:
- sending a time-domain reflectometry (TDR) signal from a point of measurement along each core of the cable, wherein the TDR signal is sent while each core is energised by a phase voltage;
- receiving, at the point of measurement, one or more reflections of the TDR signal from each core, wherein the one or more reflections are received while each core is energised by a phase voltage;

generating reflectometry data for each core by correlating the TDR signal sent along each core with the one or more reflections of the TDR signal received from a respective core, wherein the reflectometry data is indicative of an impedance change at each of a plurality of points along a respective core; and detecting motion of the cable by comparing the reflectometry data generated for each core with reference reflectometry data for the respective core, the reference reflectometry data having been previously obtained when the cable was in a baseline position.

17. The apparatus of claim 15, wherein the processor is further configured to:

send a plurality of TDR signals from the point of measurement along each core of the cable, each of the plurality of TDR signals being sent at a respective one of a plurality of points in time;

receive a plurality of reflections from each core, each of the plurality of reflections corresponding to one of the plurality of TDR signals; and correlate each TDR signal sent along each core with its corresponding reflections.

18. The apparatus of claim 17, wherein the processor is further configured to:

select, from the reflectometry data, a measurement section for each core, wherein the measurement section comprises measurements of impedance change over time at a given point on the core; and detect motion of the cable by comparing the measurement section for each core with a reference time-series, wherein the reference time-series comprises measurements of impedance change over time at the given point on the core when the cable was in the baseline position.

19. The apparatus of claim 18, wherein the processor is further configured to:

compare the measurement section with the reference time-series by applying a dynamic time warping algorithm to the measurement section and/or the reference time-series.

20. The apparatus of claim 15, wherein the processor is further configured to:

virtually reconstruct a shape of the cable with respect to the baseline position.

* * * * *